United States Patent [19]

Weynachter et al.

[11] Patent Number: 5,272,440
[45] Date of Patent: Dec. 21, 1993

[54] ISOLATION MONITORS AND MEASURING DEVICE FOR AN ELECTRICAL POWER SYSTEM WITH ISOLATED NEUTRAL

[75] Inventors: Luc Weynachter, Grenoble; Christian Pellegrin, Coublevie; Patrice Alain, Meylan, all of France

[73] Assignee: Merlin Gerin, France

[21] Appl. No.: 883,216

[22] Filed: May 14, 1992

[30] Foreign Application Priority Data

May 21, 1991 [FR] France ................... 91 06307

[51] Int. Cl.$^5$ ......................................... G01R 31/08
[52] U.S. Cl. .................... 324/522; 324/510; 324/541
[58] Field of Search ............. 324/510, 521, 522, 509, 324/541, 539, 551, 520, 544, 659, 676, 681, 711, 718

[56] References Cited

U.S. PATENT DOCUMENTS

| | | | |
|---|---|---|---|
| 3,293,497 | 12/1966 | Brandler et al. | 324/509 |
| 3,938,006 | 2/1976 | Gadwal et al. | 324/509 |
| 3,971,007 | 7/1976 | Borkovitz et al. | 324/510 |
| 4,321,643 | 3/1982 | Vernier | 324/509 |
| 4,906,937 | 3/1990 | Wikstrom et al. | 324/552 |
| 5,066,920 | 11/1991 | Suptitz | 324/544 |
| 5,075,628 | 12/1991 | Schuster et al. | 324/510 |
| 5,101,160 | 3/1992 | Barjonnet et al. | 324/541 |

FOREIGN PATENT DOCUMENTS

| | | |
|---|---|---|
| 0035365 | 9/1981 | European Pat. Off. . |
| 0166839 | 1/1986 | European Pat. Off. . |
| 0399923 | 11/1990 | European Pat. Off. . |
| 1443140 | 5/1966 | France . |
| 0276075 | 11/1989 | Japan ................ 324/522 |
| 1481695 | 5/1989 | U.S.S.R. ............ 324/521 |

OTHER PUBLICATIONS

2048 Techniques CEM (1980) Mar. 1980, pp. 48-56.

Primary Examiner—Kenneth A. Wieder
Assistant Examiner—Christopher M. Tobin
Attorney, Agent, or Firm—Parkhurst, Wendel & Rossi

[57] ABSTRACT

An isolation monitor is electrically connected between the earth and an isolated neutral of a transformer which supplies AC electrical power to the main distribution network. In order to measure and to locate an isolation fault occurring somewhere on the feeders, each feeder is equipped with a toroid current measuring transformer, and comprises further a secondary winding connected to a processing locator performing synchronous demodulation. Two first and second transmission lines are provided between the isolation monitor and the locator. The first synchronous line transmits synchronization pluses from the monitor to the locator, and the second line transmits to the locator the demodulated values of the input voltage furnished by the monitor.

7 Claims, 5 Drawing Sheets

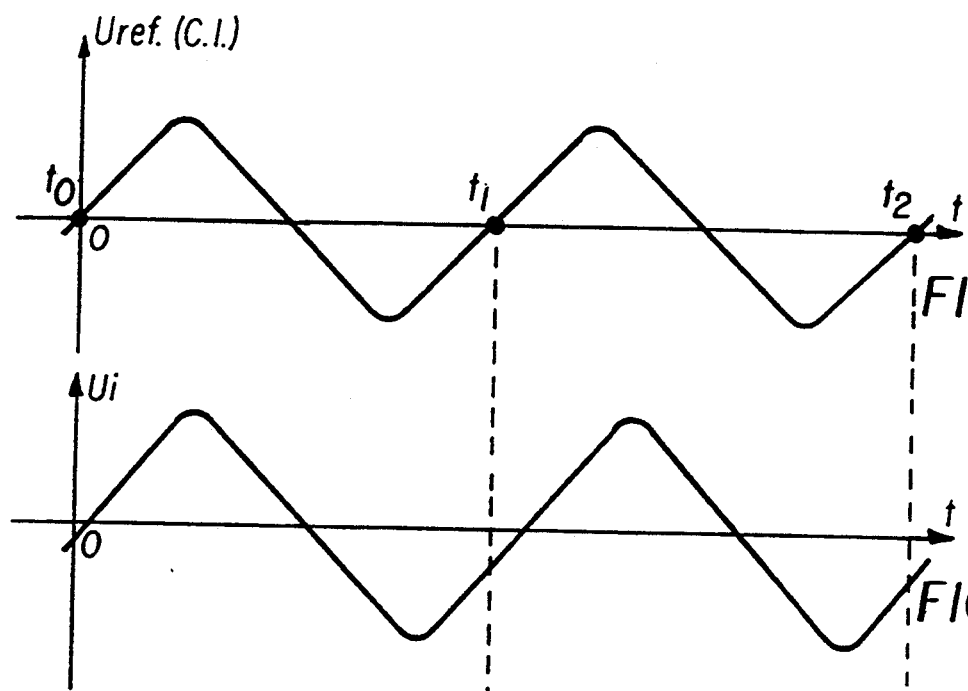
FIG. 3A
FIG. 3B
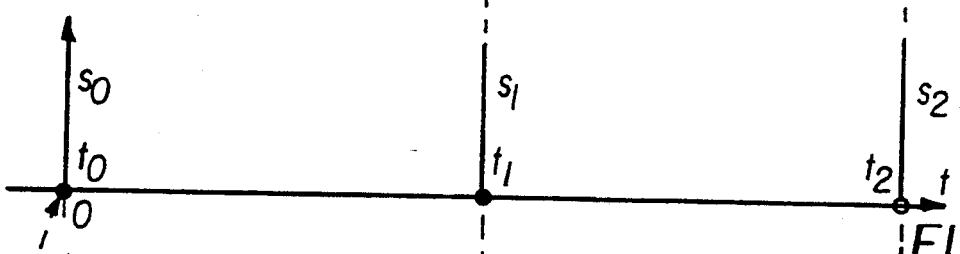
FIG. 3C
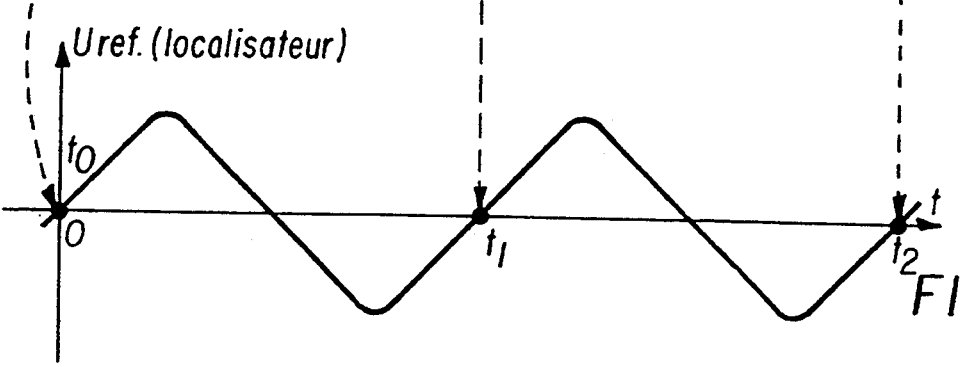
FIG. 3D

ISOLATION MONITORS AND MEASURING DEVICE FOR AN ELECTRICAL POWER SYSTEM WITH ISOLATED NEUTRAL

BACKGROUND OF THE INVENTION

The present invention relates to a device for monitoring and measuring isolation, more commonly called "isolation monitor", for an electrical power supply system, such as a single- or three-phase A.C. electrical power supply system, this electrical power supply system being of the isolated neutral type so that the load impedance or impedances are then connected between a phase and this isolated neutral, and not between this phase and earth.

A state-of-the-art isolation monitor of the type mentioned above is for example described in U.S. Pat. No. 5,101,160.

A device of this type operates in the following manner:

Referring to FIG. 1 representing the former art, a three-phase power supply transformer 1, star-connected with isolated neutral N, supplies A.C. electrical power to the three distribution busbars I,II,III of the power supply system which supplies electrical power to several load impedances $Z1, Z2, \ldots, Zp, \ldots$, the latter being respectively connected to the same number of three-phase feeders $D1, D2, \ldots Dp, \ldots$, of this main distribution system.

It is assumed that one of the load impedances, for example impedance Zp, has an isolation fault with respect to earth which results in the harmful presence, between at least one of the three phase wires of the corresponding feeder Dp and earth, of a leakage impedance Zf constituted by a leakage resistance Rf in parallel with a leakage capacitance Cf.

To detect and measure this fault, an isolation monitor C.I., which is serially connected between the isolated neutral N and earth with a measuring resistance Rm, inputs to the power supply system I,II,III, an A.C. voltage called "reference voltage", of voltage Ui and of a frequency lower than that of the A.C. supply current, this input frequency being for example comprised between 4 and 10 Hertz for a 50 or 60 Hertz A.C. power supply system.

The presence of the isolation fault results, following input of the reference voltage Ui to the power system, in a leakage current If flowing in the leakage impedance Zf, this current If naturally being at the frequency of the input voltage Ui and being fed back to the isolation monitor C.I. via earth and the measuring resistance Rm.

The isolation monitor C.I. in addition itself generates an auxiliary sine wave and cosine wave which enable it, by a conventional process called synchronous demodulation or detection, to determine two components, taken along the same real and imaginary reference axes of the vectors representative of the input voltage Ui and the leakage current If (i.e. in fact the input current). From these components it deduces the phase difference between these vectors Ui and If, and thence the values of the leakage resistance Rf and leakage capacitance Cf.

These state-of-the-art isolation monitors enable an isolation fault occurring somewhere on the power supply system to be detected and measured. They do not however enable this fault to be located, which then means that long and costly fault location is necessary. Furthermore, they are naturally unable to determine whether a single isolation fault at a specific point of the power system is involved, or whether on the other hand multiple isolation faults are involved.

SUMMARY OF THE INVENTION

The object of the invention is to overcome these drawbacks. It relates for this purpose to a device for monitoring and measuring the isolation for an electrical power supply system with isolated neutral, this power supply system comprising several feeders each supplying at least one load, an overall isolation monitor, designed to determine the leakage impedance of the power supply system without being able to locate it, being provided and comprising:

means for generating an A.C. signal input to the power supply system;

means for generating, internally, two reference A.C. signals, with a phase difference of 90 degrees with respect to one another, of the same frequency as said A.C. signal;

means for measuring both the voltage Ui of said signal input to the power supply system and the overall leakage current If of the power supply system;

processing means, by synchronous demodulation or detection, using said two reference A.C. signals, to determine their real and imaginary parts with respect to the real axis defined by one of these two reference signals, so as to deduce therefrom the resistive and capacitive components of the overall leakage impedance.

This device being characterized by the fact that it comprises in addition, on each of said feeders, first means for measuring the local leakage current flowing in said feeder by the presence of the A.C. signal input to the power supply system, said measuring signal being applied to a processing installation, or "locator", comprising second means for performing synchronous demodulation or detection of the local leakage current in each feeder, by means of two reference A.C. signals having the same characteristics as those generated by said overall isolation monitor, and at least two remote transmission lines arranged between the overall isolation monitor and the locator, and comprising:

a first synchronous line transmitting synchronization pulses of the reference A.C. signals of the locator on those of the overall isolation monitor;

and a second line transmitting to the locator the demodulated values of the input voltage established by the overall isolation monitor for computation of the local leakage impedance in the feeder involved.

BRIEF DESCRIPTION OF THE DRAWINGS

Anyway, the invention will be well understood, and its advantages and other features will become more clearly apparent from the following description of an illustrative embodiment of this isolation monitoring device with locator, given as a nonrestrictive example only and represented in the accompanying drawing, in which:

FIGS. 3A to 3D are curves explaining the operation of the synchronization performed, according to the invention, between the overall isolation monitor and the locator;

DESCRIPTION OF THE PREFERRED EMBODIMENT

Figure 1:
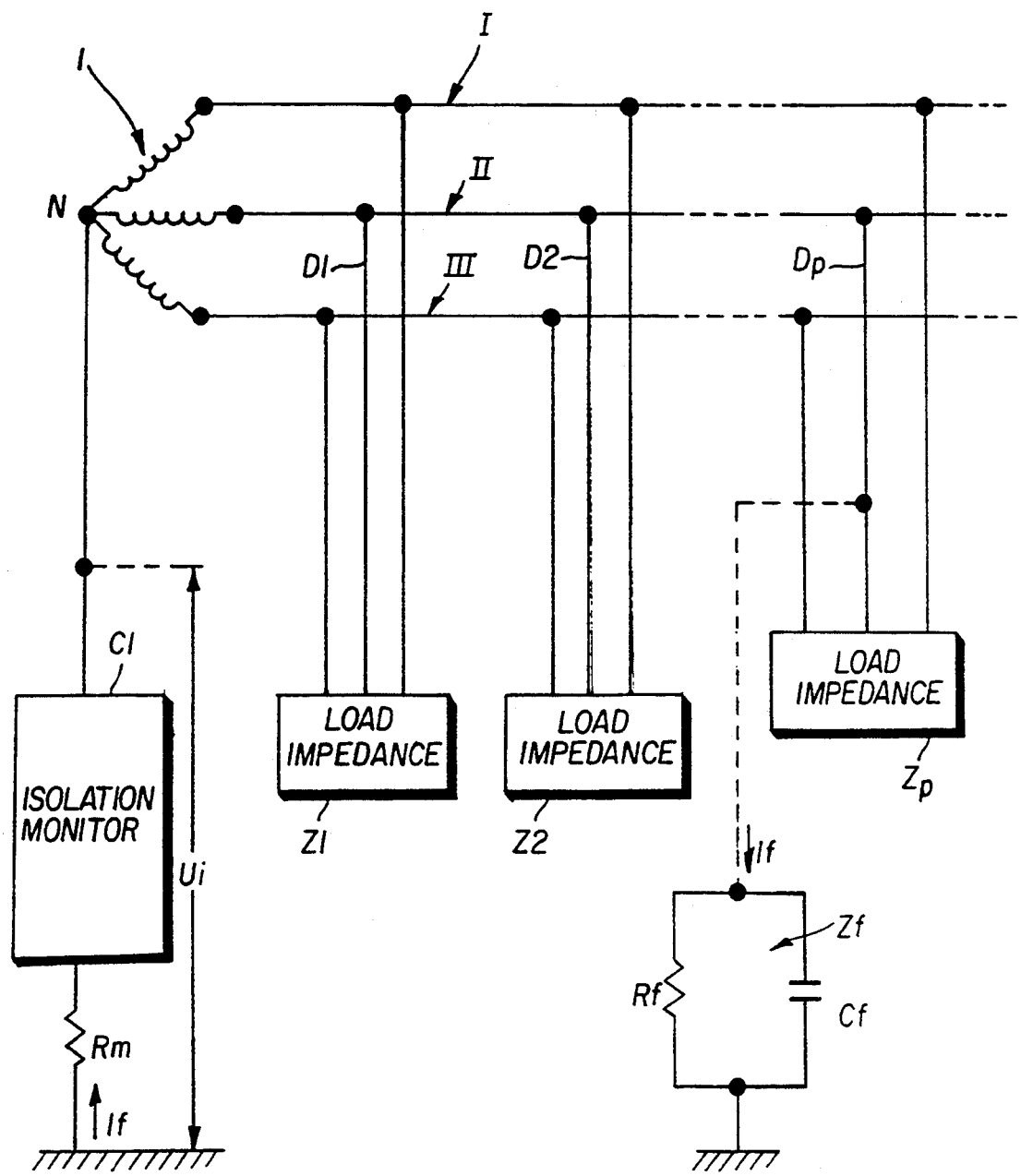
FIG. 1 illustrates a conventional distribution system.
Figure 2:
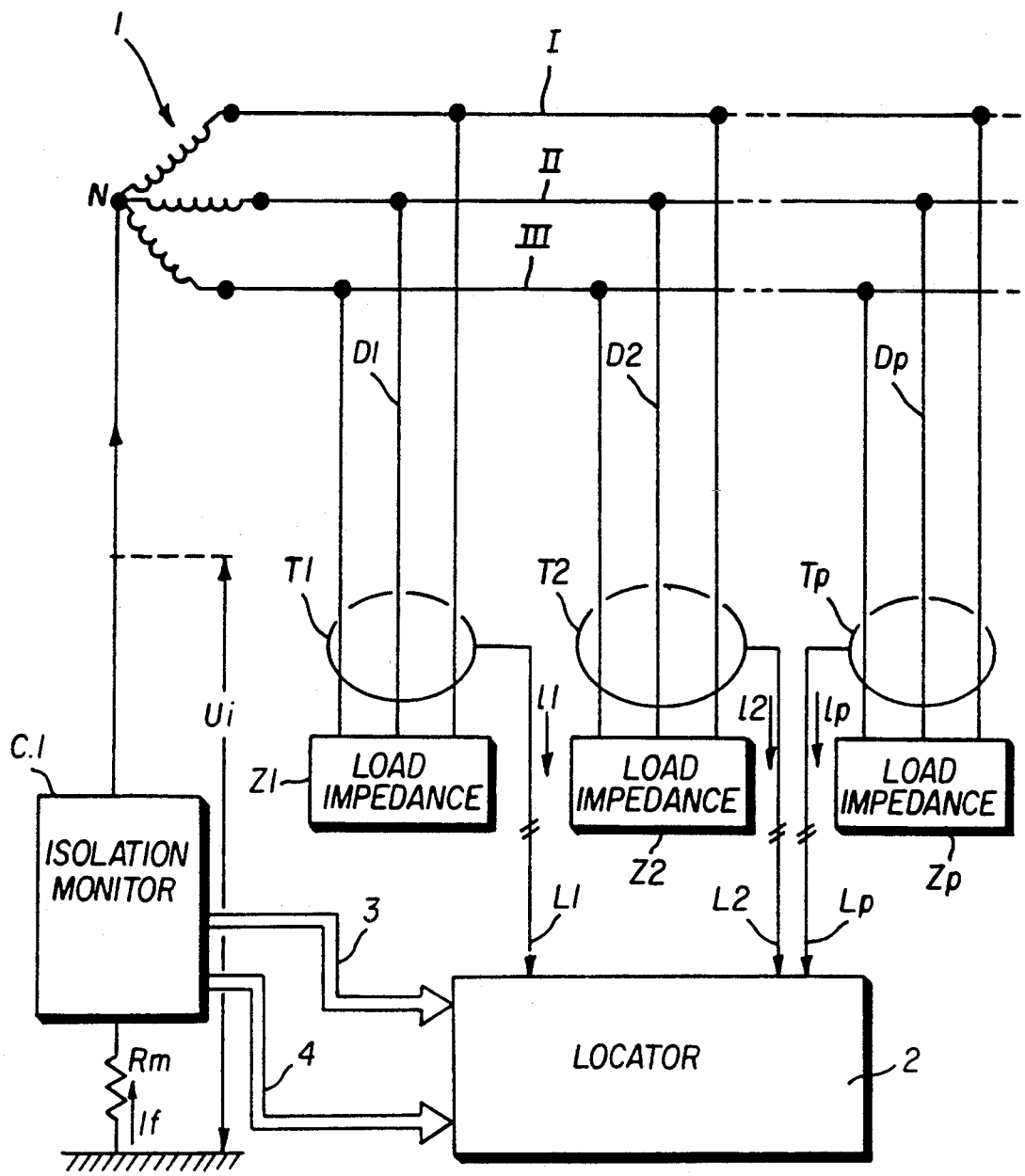
FIG. 2 is an overall block diagram of this installation.

Referring first of all to FIG. 2, this installation differs from the one described above with reference to FIG. 1 by the fact that a toroid current measuring transformer, respectively T1, T2, ..., Tp, ..., is placed around each of the above-mentioned feeders D1, D2, ..., Dp, ... The current measuring signal which is delivered by each of the transformers T1 to Tp is applied, via a two-wire line L1, L2, ..., Lp, ..., to a processing and computing unit 2 which will be called "locator".

It should be noted that in principle, provided that the three-phase power supply system is well balanced, the outputs L1, L2, ... Lp, ..., of the toroid transformers normally only supply a signal at the previously mentioned input frequency, as the 50 Hertz A.C. signals are cancelled out. In the event of an isolation fault occurring, this may not be achieved and, in addition to the 50 Hertz current rejector filters, the locator 2 comprises a special circuit for measuring the 50 Hertz current, which will be described further on.

Essentially, the locator 2 comprises a central processor and measuring, acquisition, and numerical processing channels which are practically identical to those of the overall isolation monitor C.I., and for example described in detail in the above-mentioned U.S. Pat. No. 5,101,160.

The locator 2 performs synchronous demodulation of the measuring current or currents I1, and/or I2, ... and/or Ip, ..., flowing in the two-wire line or lines L1 and/or L2, ..., and/or Lp, ..., by means of a reference sine wave and cosine wave generated by itself, and having the same frequency as those generated by the overall isolation monitor C.I.

The synchronous demodulation performed by the locator 2 enables the real and imaginary components of the leakage current in the feeder or feeders to be obtained where such a leakage exists. The locator 2 also enables the feeder in which the fault has occurred to be located. To enable the resistive and capacitive components of the leakage impedance in this feeder, or in each of these feeders, to be computed, the locator 2 has to know the corresponding real and imaginary values (i.e. taken along the same reference axes) of the voltage at the terminals of the fault.

The voltage at the terminals of the fault corresponds in fact to the input voltage Ui which is the same throughout the power supply system.

According to an essential feature of the present invention, the locator 2 uses directly, for computation of the components of the leakage impedance or impedances in the feeder or feeders, the demodulated data of the input voltage Ui previously computed, by measurement and by synchronous demodulation, in the overall isolation monitor C.I. For this purpose, two distinct remote transmission lines are provided between the isolation monitor C.I. and the locator 2:

a first line 3, which is necessarily a synchronous line, and which transmits fixed synchronization pulses of the reference sine wave generated by the isolation monitor C.I.

and a second line 4, which can be an asynchronous line, and which transmits to the locator 2 the demodulated values of the input voltage Ui which are established by the monitor C.I.

It should be noted that this phasing, or synchronization, of the two reference sine waves respectively generated by the monitor C.I. and the locator 2 is indispensable for determination of the components of the local leakage impedances, since this determination requires the real and imaginary components of the voltage and current at the terminals of each leakage impedance to be known, these components necessarily being determined with respect to the same reference axes.

Referring for the sake of increased clarity to diagrams 3A to 3D, the following are represented therein:

in FIG. 3A the reference sine wave at a frequency comprised between 4 and 10 Hertz, which is generated, for example in the manner described in U.S. Pat. No. 5,101,160, internally by the overall isolation monitor C.I., and which is used by the latter on the one hand to perform synchronous demodulation of the measured leakage current If and input voltage Ui, and on the other hand to generate this reference input voltage Ui.

in FIG. 3B, the input voltage Ui has undergone a phase shift with respect to the reference voltage of FIG. 3A. The phase shift is due to the presence of an input filter comprising in particular a trap circuit tuned to the 50 Hertz frequency of the power supply system. To obtain the phase difference $\phi$ between the input voltage Ui and the leakage current If, synchronous demodulation has to be performed enabling the phases $\phi 2$ and $\phi 1$ of the vectors representative of Ui and If with respect to a reference axis to be determined. Calculation of the phase shift sought for is performed by the relation: $\phi = \phi 2 - \phi 1$.

in FIG. 3C, the synchronization pulses or "strokes" s0, s1, s2, ..., are generated by the isolation monitor C.I. and transmitted to the locator 2 via the synchronous link bus 3 each time zero is reached at the beginning of each half-wave of the reference voltage of the monitor C.I., which takes place at times t0, t1, t2, ...

and finally in FIG. 3D the reference sine wave, identical to the one according to FIG. 3A, which is generated by the locator 2 and used internally to perform synchronous demodulation of the above-mentioned local current or currents I1, I2, ... Ip. As represented schematically by the dashed arrows, this sine wave is synchronized by the strokes s0, s1, s2, ..., according to FIG. 3C, so that the moments when it passes zero at the beginning of each half-wave are the above-mentioned moments t0, t1, t2, ..., so that finally this reference sine wave of the locator is exactly in phase with that (FIG. 3A) of the overall isolation monitor C.I.

Returning now to the overall block diagram in FIG. 2, it has been seen that each of the local measuring currents I1, I2, ... Ip ..., was determined by means of a measuring transformer T1, T2, ..., Tp, ... However a toroid measuring transformer of this kind is an inductive component which introduces a phase shift of the form:

$$\phi = Arc\ tg \cdot R/lw.$$

where R and l are the resistance and inductance of the toroid winding, and w is the pulse of the measuring current at a frequency comprised between 4 and 10 Hertz.

According to an advantageous feature of the invention, means are provided at the level of the locator 2 for measuring, from time to time, the values of R and l of each toroid to deduce therefrom the corresponding phase shift $\phi$, in order to take the latter into account when computation of the leakage impedance(s) is performed by the locator 2.

Figure 4:
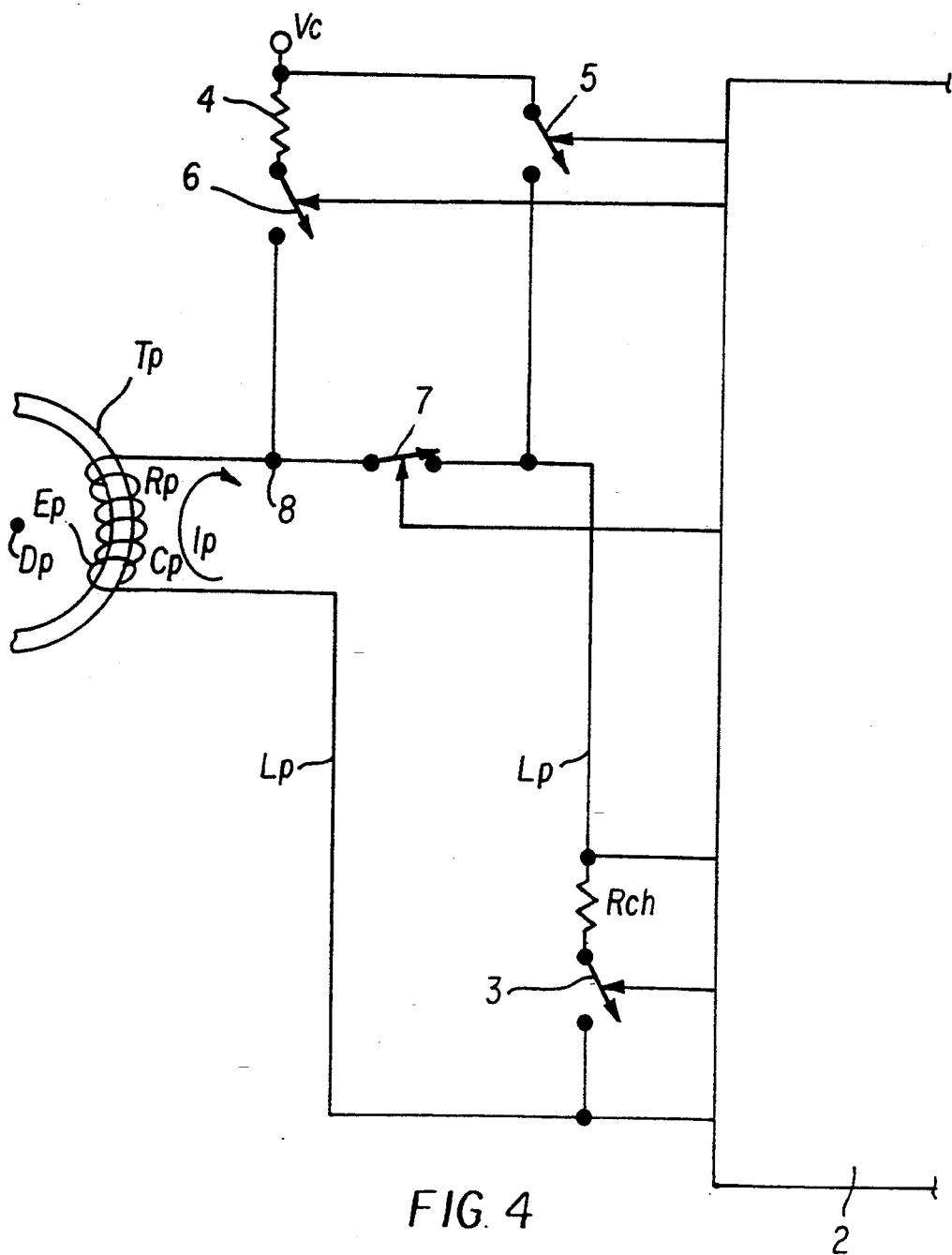
FIG. 4 is a simplified diagram of the device for measuring and correcting the phase difference introduced locally for each toroid current measuring transformer.

These means are represented schematically in FIG. 4, applied to the toroid Tp for example. Naturally, they are identical for each of the other toroids of this installation. In this FIG. 4, the toroid Tp is provided with a secondary winding Ep through which the above-mentioned measuring current Ip flows, and which has a resistance and inductance Rp and lp. The three busbars or feeder conductors Dp have been symbolically represented by a single busbar.

In order to perform a correction relative to the disturbance phase shift introduced by the toroid Tp, the locator 2 needs to know the values of Rp and lp.

Measurement of the inductance lp is performed in a very simple manner, and by a process similar to the one described in the U.S. Pat. No. 5,066,920 filed by the applicant, providing for the possibility of connecting a charging resistance Rch to the terminals of the winding Ep of the transformer Tp, by means of a static switch 3 controlled by the locator 2.

When the static switch 3 is open, the "no-load" voltage which is measured by the locator 2 at the terminals of the two wires Lp is of the form:

$$V(\text{no-load}) = lw/Np \cdot Ip \quad (I)$$

where Np is the number of turns of the winding Ep.

When the switch 3 is closed, the "load" voltage which is measured in the same way by the locator 2 is of the form:

$$V(\text{load}) = Rch/Np \cdot Ip \quad (II)$$

The locator 2 easily deduces the value of the inductance 1 sought for from the two equations (I) and (II).

The measurement of the resistance Rp of the winding Ep is a potentiometric measurement using an auxiliary D.C. voltage Vc and an auxiliary resistance 4 which is capable of being connected serially with the winding Ep in such a way as to achieve a potentiometric assembly In addition, three other static switches controlled by the locator 2 are provided, as follows:

a switch 5 designed to connect the D.C. voltage terminal Vc directly to the locator 2, in order for the latter to be able to perform its measurement;

a switch 6 capable of applying the voltage Vc to the winding Ep via the potentiometric measuring resistance; and a switch 7 placed on the connection Lp between switches 6 and 5 and capable, when it is open at the same time as switch 6 is, of enabling the voltage terminal Vc to be selectively connected to the locator 2, via switch 5 which is then closed.

In the open state of switch 3, measuring of the resistance Rp is performed in the following manner:

switches 6 and 7 being open and switch 5 closed, the locator 2 measures the value of the auxiliary D.C. voltage Vc;

then, with switch 5 open and switches 6 and 7 closed, it measures the value of the D.C. voltage Vc at the point 8 common to the two resistances 4 and Rp;

it then computes the value of the resistance Rp by applying the formula:

$$Uc = Vc \times Rp/Rp + R4$$

where R4 is the known value of the resistance 4.

It should be noted that measurement of the phase shift of each toroid by the method which has just been described does not need to be performed with a high repetitive frequency, but only from time to time, on account of the relatively slow possible variations of the measured values. It should also be noted that the same device also enables the presence or absence of a measuring toroid in the feeder involved to be detected.

Returning again to the overall block diagram in FIG. 2, it has been seen that the overall isolation monitor C.I. performs synchronous demodulation of the input voltage Ui and leakage current If, whereas the locator 2 only performs synchronous demodulation of the measuring currents I1, I2, . . . , Ip. The measuring channels used are practically identical, but due to the presence of a low-pass filter rejecting the 50 Hertz current, they introduce different phase shifts which therefore have to be compensated. In the case of isolation monitors of the former art, not having a locator, this compensation was automatic as measurement of the phase difference between Ui and If is performed by subtraction of the respective phases. This is no longer the case for the locator 2 according to the invention, as this locator uses on the one hand the direct measurement of the local current I1,I2, . . . ,Ip, and on the other hand the measurement of Ui which was performed with the measuring channel of the isolation monitor C.I.

According to another feature of the invention, the overall isolation monitor C.I. comprises means designed for measuring, from time to time, the phase shift introduced by the measuring channel of the input voltage Ui, and for taking account of this phase shift in computing the demodulated values of this voltage Ui which are transmitted, via the line 4, to the locator 2.

The locator 2 comprises means for measuring, also from time to time, the phase shift introduced by the channel or channels measuring the local measurement current I1,I2, . . . ,Ip, and of again taking account of this phase shift in computing the demodulated values of this or these measuring current or currents.

In both cases, this measurement of the phase shift of each measuring channel is performed by input to this channel of the reference voltage which is generated locally (respectively by the monitor C.I. and by the locator 2) to perform the synchronous demodulation(s), and by then performing synchronous demodulation of the signal then received at the end of the channel with respect to the one thus input to this channel, so as to deduce therefrom the phase shift of the channel. The processing device of the monitor C.I. and locator 2 respectively then stores the value of this phase shift, so as to be able to deduce it from the subsequent phase shift measurements.

Figure 5:
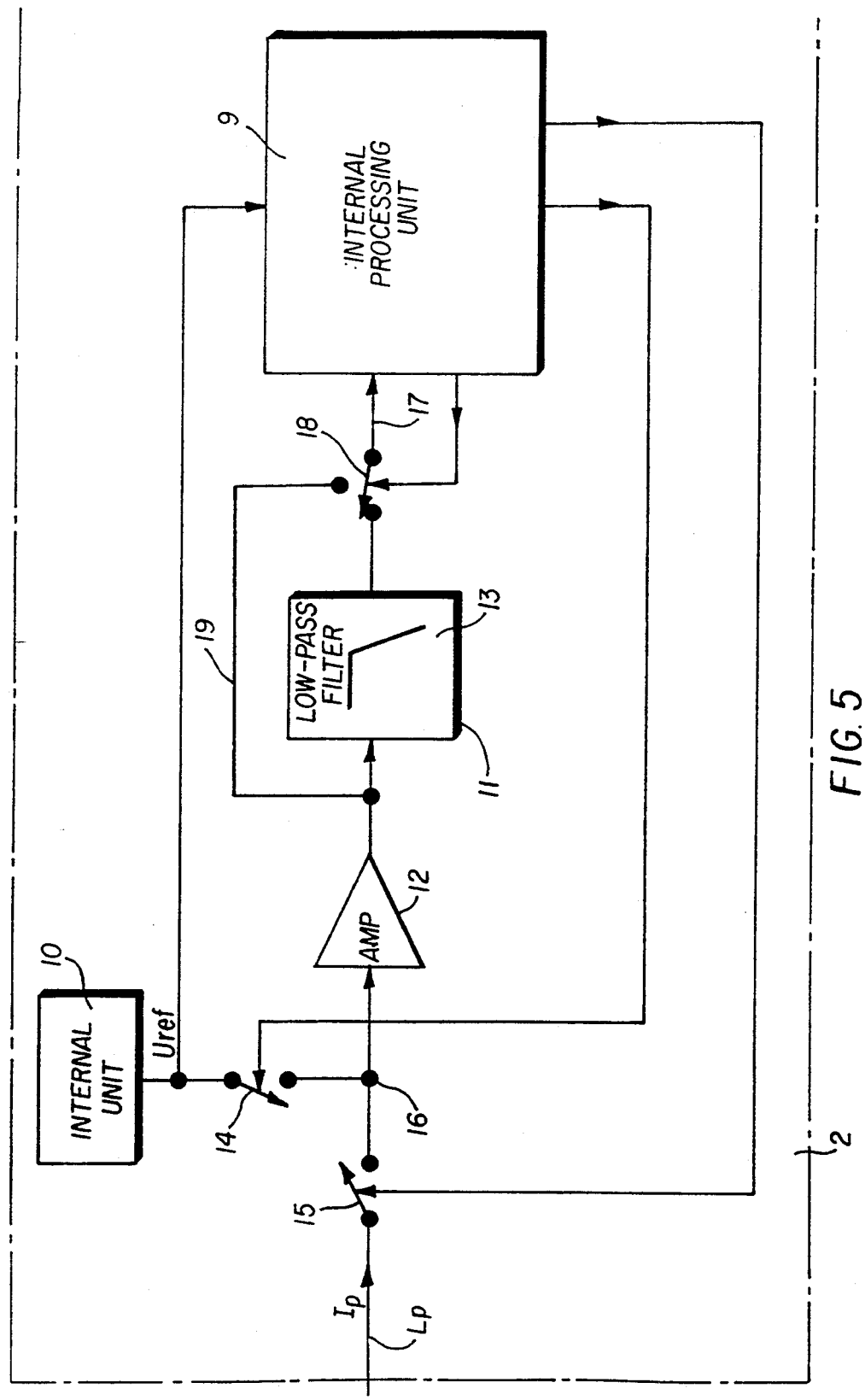
FIG. 5 is a simplified diagram of one of the phase difference measuring devices of a channel, with auxiliary measuring of the 50 Hertz current, which equips this installation.

FIG. 5 is a block diagram of a circuit of this kind for measuring the phase shift, as applied in this example to a measuring channel of the locator 2, the diagram relating to the circuit equipping the monitor C.I. naturally being practically the same.

In FIG. 5, some component parts of the locator 2 have been represented, including:

the internal processing unit 9;

the internal unit 10 for generating the reference voltage Uref which is used by the unit 9 to perform synchronous demodulation of the measuring current or currents Ip;

the measuring channel 11, partially represented with its high gain amplifier 12 followed by its low-pass filter 13 for rejecting the 50 Hertz current.

According to the above-mentioned measuring means, the possibility is also provided, from time to time, of isolating the measuring channel 11 from the measuring line Lp, by means of a first static switch 15 controlled by the processing unit 9, and of then connecting the input 16 of this channel, via another static switch 14 also controlled by the unit 9, to the output of the circuit 10 delivering the reference voltage Uref.

The unit 9 then performs synchronous demodulation of the voltage thus obtained at the end of the channel, at the point referenced 17, and compares it with the voltage Uref at the output of the circuit 10 to deduce therefrom the phase shift of the channel 11. It can then deduce this phase shift from the subsequent measurements of the current or currents Ip which will be obtained after switching of the switches 14 and 15.

Naturally, the measuring channel of the monitor C.I. is equipped with an identical device to measure locally and internally the phase shift generated by its own measuring channel.

Finally, it should be noted that it has been assumed up to now that the three phases of the feeders D1,D2, ... Dp, were well balanced, so that the 50 Hertz currents were practically nonexistent in the measuring lines L1,L2, ... ,Lp, ... However in the case of a resistive isolation fault, a 50 Hertz current is liable to flow between the faulty phase and the sum of the nuisance capacitances present on the other two phases. The value of such a current can sometimes exceed one ampere. This 50 Hertz current can then saturate the amplifier 12 of the measuring channel 11 (FIG. 5), which makes measurement of the current I1 for example impossible.

According to the invention, and to overcome this drawback, two additional measures are preferably adopted:

The measuring channel or channels 11 of the locator are arranged to support a preset threshold current, for example 500 milliamperes. It can in fact be observed, by plotting the curves, that the fault resistance is limited to a fixed value whatever the equivalent nuisance capacitance. For a 380 volt power supply system for example, the fault resistance remains lower than about 450 ohms whereas the fault current remains lower than 500 mA.

Means are provided for measuring, from time to time, the amplitude of the 50 Hertz current present at the input of or upline from the rejector filter 13 of the measuring channel, to indicate to the user that the above-mentioned threshold has been exceeded in order to inform him of the presence of a clean fault in the feeder Dp involved. In FIG. 5, these means comprise a two-way static switch 18 which is controlled by the processing unit 9 and which, placed as shown between the filter 13 and this unit 9, enables this filter 13 to be short-circuited from time to time, by means of the branch line 19, to perform measurement of the 50 Hertz current. If the threshold is exceeded, the user is informed for example by an alarm triggered by the processing unit 9, and also enabling the clean fault to be located.

The invention is naturally in no way limited to the embodiment which has just been described. In particular, a multiplexing device enabling a single channel to be used for several measuring toroids can advantageously be provided in the locator 2, in order to reduce the number of measuring channels 11.

We claim:

1. A device for monitoring and measuring the isolation of an electrical power supply system including an isolated neutral and several feeders, said device comprising:
an overall isolation monitor means for generating a main A.C. signal and two auxiliary reference A.C. signals, with a phase difference of 90 degrees with respect to one another, of the same frequency as said main A.C. signal, wherein said main A.C. signal is supplied as an input A.C. signal to the power supply system and said overall isolation monitor means measures the voltage of said input A.C. signal to the power supply system, the overall leakage current of the power supply system, and determines, by synchronous demodulation or detection using said two auxiliary reference A.C. signals, the resistive and capacitive components of the overall leakage impedance of the power supply system;
measuring means, including a toroid current transformer surrounding a corresponding feeder, for measuring the local leakage current flowing in each of said feeders by the presence of the A.C. input signal to the power supply system;
locator means for performing synchronous demodulation or detection of the local leakage current in each feeder measured by said measuring means, by means of two locator auxiliary reference A.C. signals having the same characteristics as those generated by said overall isolation monitor means; and
at least two transmission lines arranged between the overall isolation monitor means and the locator means, said lines including a first synchronous line for transmitting synchronization pulses generated by the overall isolation monitor means to the locator means; and a second line for transmitting to the locator means the demodulated values of the A.C. signal input voltage established by the overall isolation monitor means for computation of the local leakage impedance in the feeder involved.

2. The device according to claim 1, further comprising means for measuring the values of the resistance and inductance of a secondary winding of each measuring toroid current transformer, to deduce therefrom the phase shift due to the secondary winding.

3. The device according to claim 2, wherein said means for measuring the values of the resistance and inductance of said secondary windings uses an auxiliary D.C. voltage and an auxiliary resistance designed to be connected serially with said secondary windings to achieve a potentiometric measuring circuit.

4. The device according to claim 1, wherein said overall isolation monitor means includes means for measuring a phase shift introduced by a measuring channel of the input voltage, and said overall isolation monitor means uses the phase shift as a correcting parameter in computing the demodulated values of the voltage which are transmitted, via the second line, to the locator means; and said locator means includes means for measuring a phase shift introduced by a measuring channel or channels of the local leakage current, said phase shift being used as a correcting parameter by the locator means in computing the demodulated values of the local leakage current.

5. The device according to claim 4, wherein said means for measuring the phase shift included in said locator means performs synchronous demodulation or detection of output signal obtained at the end of the measuring channel and compares the output signal to an input signal supplied to the measuring channel, so as to deduce therefrom the phase shift of the measuring channel.

6. The device according to claim 1, wherein:
a measuring channel or channels of the locator means are dimensioned so as to support a preset threshold current, for example of about 500 milliamperes for a 380 volt power supply system, and
the measuring channel or channels include means for measuring the amplitude of the current at the power supply system frequency which is present upline from a rejector filter included in the measuring channel and for indicating to a user that said threshold has been exceeded in order to inform the user of the presence of a clean fault in a feeder being monitored by the measuring channel.

7. The device according to claim 6, wherein said means for measuring the amplitude of the current comprises a static switch which is controlled by a processing unit of the locator means and which enables the rejector filter to be short-circuited from time to time, by means of a branch line, to perform measuring of the current at the power supply system frequency.

* * * * *